(12) United States Patent
Mitsuya et al.

(10) Patent No.: US 8,314,419 B2
(45) Date of Patent: Nov. 20, 2012

(54) LIGHT-EMITTING ELEMENT, LIGHT-EMITTING DEVICE, DISPLAY, AND ELECTRONIC EQUIPMENT

(75) Inventors: Masayuki Mitsuya, Chino (JP); Koji Yasukawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 290 days.

(21) Appl. No.: 12/711,588

(22) Filed: Feb. 24, 2010

(65) Prior Publication Data
US 2010/0230688 A1    Sep. 16, 2010

(30) Foreign Application Priority Data

Mar. 16, 2009   (JP) .................................. 2009-063556

(51) Int. Cl.
*H01L 35/24* (2006.01)
(52) U.S. Cl. ...................... 257/40; 257/89; 257/E51.001
(58) Field of Classification Search .................... 257/40, 257/89, E51.001
See application file for complete search history.

(56) References Cited

U.S. PATENT DOCUMENTS

| | | | |
|---|---|---|---|
| 7,737,625 B2 | 6/2010 | Arakane et al. | |
| 8,026,662 B2 | 9/2011 | Ishihara et al. | |
| 8,035,297 B2 | 10/2011 | Arakane et al. | |
| 2006/0227079 A1 | 10/2006 | Kashiwabara | |

FOREIGN PATENT DOCUMENTS

| | | |
|---|---|---|
| JP | A-2005-100921 | 4/2005 |
| JP | A-2005-285708 | 10/2005 |
| JP | A-2007-299645 | 11/2007 |
| JP | A-2009-048828 | 3/2009 |
| JP | A-2009-76528 | 4/2009 |
| WO | WO 2005/112518 A1 | 11/2005 |

*Primary Examiner* — Anthony Ho
(74) *Attorney, Agent, or Firm* — Oliff & Berridge, PLC

(57) ABSTRACT

Provided is a light-emitting element including a cathode; an anode; a first light-emitting layer that is disposed between the cathode and the anode and emits in a first color; a second light-emitting layer that is disposed between the first light-emitting layer and the cathode and emits in a second color that is different from the first color; and an intermediate layer that is disposed between the first light-emitting layer and the second light-emitting layer so as to be in contact with these layers and has a function of controlling the migration of holes and electrons between the first light-emitting layer and the second light-emitting layer. The intermediate layer is constituted of a first layer that is in contact with the first light-emitting layer and is constituted of a hole-transporting material serving as a main material and a second layer that is in contact with the first layer and also with the second light-emitting layer and is constituted of a material mixture, serving as a main material, of a material having an acene skeleton and a hole-transporting material.

14 Claims, 5 Drawing Sheets

LIGHT-EMITTING ELEMENT, LIGHT-EMITTING DEVICE, DISPLAY, AND ELECTRONIC EQUIPMENT

BACKGROUND

1. Technical Field

The present invention relates to a light-emitting element, a light-emitting device, a display, and electronic equipment.

2. Related Art

Organic electroluminescence elements (so-called organic EL elements) are light-emitting elements each having a structure in which at least one light-emitting organic layer is disposed between an anode and a cathode. In such a light-emitting element, by applying an electric field between the cathode and the anode, electrons are injected into the light-emitting layer from the cathode side, and holes are injected from the anode side. The electrons and the holes are recombined in the light-emitting layer to generate excitons, and energy when the excitons return to the ground state is emitted as light.

As such a light-emitting element, for example, one that has three light-emitting layers corresponding to three colors, R (red), G (green), and B (blue), are laminated between a cathode and an anode and emits white light is known (for example, see JP-A-2005-100921). This light-emitting element that emits white light can display a full color image by being used in a combination with three color filters of R (red), G (green), and B (blue) for the corresponding pixels.

In the light-emitting element disclosed in JP-A-2005-100921, an intermediate layer constituted of a hole-transporting material is disposed between light-emitting layers. This intermediate layer restricts the transportation of electrons from the light-emitting layer on the cathode side to the light-emitting layer on the anode side, and thereby each light-emitting layer is allowed to emit light in a balanced manner. In addition, such an intermediate layer efficiently transports holes from the light-emitting layer on the anode side to the light-emitting layer on the cathode side, and thereby the luminous efficiency of the light-emitting element can be enhanced.

However, in the light-emitting element according to the invention of JP-A-2005-100921, electrons accumulate near the interface between the intermediate layer and the light-emitting layer on the cathode side, which causes a problem that the light-emitting layer on the cathode side is deteriorated, resulting in a reduction in the lifetime of the light-emitting element.

SUMMARY

An advantage of some aspects of the invention is to provide a light-emitting element of which lifetime is increased, while light is emitted in a well-balanced manner and with excellent luminous efficiency, and highly reliable light-emitting device, display, and electronic equipment that have the light-emitting elements.

Such an advantage can be achieved by the following invention.

The light-emitting element of the invention includes
a cathode;
an anode;
a first light-emitting layer that is disposed between the cathode and the anode and emits in a first color;
a second light-emitting layer that is disposed between the first light-emitting layer and the cathode and emits in a second color that is different from the first color; and
an intermediate layer that is disposed between the first light-emitting layer and the second light-emitting layer so as to be in contact with these layers and has a function of controlling the migration of holes and electrons between the first light-emitting layer and the second light-emitting layer,
wherein the intermediate layer is constituted of a first layer that is in contact with the first light-emitting layer and is constituted of a hole-transporting material serving as a main material and a second layer that is in contact with the first layer and also with the second light-emitting layer and is constituted of a material mixture, serving as a main material, of a material having an acene skeleton and a hole-transporting material.

By doing so, the second layer of the intermediate layer can efficiently transport electrons form the second light-emitting layer to the first layer of the intermediate layer. Therefore, the amount of electrons that accumulate near the interface between the intermediate layer and the second light-emitting layer can be suppressed. As a result, the deterioration of the second light-emitting layer can be prevented, and the lifetime of the light-emitting element can be increased.

In addition, the first layer of the intermediate layer can restrict the amount of electrons transported from the second layer of the intermediate layer to the first light-emitting layer. Therefore, the amount of electrons injected into the first light-emitting layer and the amount of electrons injected into the second light-emitting layer can be equalized. As a result, the first light-emitting layer and the second light-emitting layer of the light-emitting element can be well balanced in light emission.

Furthermore, the first layer of the intermediate layer can efficiently transport holes from the first light-emitting layer to the second layer of the intermediate layer. Therefore, holes can be efficiently transported from the first light-emitting layer to the second light-emitting layer through the intermediate layer. As a result, excellent luminous efficiency is imparted to the light-emitting element.

In the light-emitting element of the invention, the first layer is preferably constituted such that electrons are tunnel-injected from the second light-emitting layer side to the first light-emitting layer side.

By doing so, electrons can be transported from the second layer of the intermediate layer to the first light-emitting layer through the first layer of the intermediate layer. Therefore, the amount of electrons that accumulate near the interface between the first layer and the second layer can be suppressed. As a result, the deterioration of the intermediate layer (particularly, the first layer) can be prevented, and the lifetime of the light-emitting element can be increased.

In the light-emitting element of the invention, the hole-transporting material serving as the main material of the first layer and the hole-transporting material contained in the second layer are preferably the same type.

By doing so, the ability of transporting holes from the first layer of the intermediate layer to the second layer of the intermediate layer can be enhanced. As a result, the luminous efficiency of the light-emitting element can be increased.

In the light-emitting element of the invention, the second light-emitting layer is preferably constituted by containing a material having an acene skeleton. The material having the acene skeleton contained in the second layer and the material having the acene skeleton contained in the second light-emitting layer are preferably the same type.

By doing so, the ability of transporting electrons from the second light-emitting layer to the second layer of the intermediate layer can be enhanced. As a result, the luminous efficiency of the light-emitting element can be increased.

In the light-emitting element of the invention, the first layer preferably has a thickness smaller than that of the second layer.

By doing so, electrons can be transported from the second layer of the intermediate layer to the first light-emitting layer, while suppressing the amount of electrons that accumulate near the interface between the intermediate layer and the second light-emitting layer.

In the light-emitting element of the invention, the thickness of the first layer is preferably 1 to 10 nm.

By doing so, the first layer of the intermediate layer can transport electrons from the second layer of the intermediate layer to the first light-emitting layer, while restricting the amount of electrons that is transported from the second layer of the intermediate layer to the first light-emitting layer. In addition, the first layer of the intermediate layer can efficiently transport holes from the first light-emitting layer to the second layer of the intermediate layer.

In the light-emitting element of the invention, the thickness of the second layer is preferably 1.5 to 10 nm.

By doing so, the amount of electrons that accumulate near the interface between the intermediate layer and the second light-emitting layer can be suppressed.

In the light-emitting element of the invention, the content A (% by mass) of the material having the acene skeleton in the second layer and the content B (% by mass) of the hole-transporting material in the second layer are preferably determined such that A:B is 10:90 to 90:10

By doing so, excellent electron-transporting ability and hole-transporting ability are imparted to the second layer of the intermediate layer.

In the light-emitting element of the invention, the first color preferably has a peak wavelength of 600 nm or more, and the second color preferably has a peak wavelength of 550 nm or less.

By doing so, the first light-emitting layer and the second light-emitting layer of the light-emitting element can be well balanced in light emission.

The light-emitting element of the invention preferably has a third light-emitting layer that is disposed between the second light-emitting layer and the cathode and emits in a third color that is different from the first and second colors.

By doing so, the first light-emitting layer, the second light-emitting layer, and the third light-emitting layer of the light-emitting element can be well balanced in light emission.

In the light-emitting element of the invention, it is preferable that the first color be red, the second color be blue, and the third color be green.

By doing so, a white light-emitting element that is excellent in luminous efficiency and has a long lifetime can be provided.

The light-emitting device of the invention includes the light-emitting element of the invention.

By doing so, a highly reliable light-emitting device can be provided.

The display of the invention includes the light-emitting element of the invention.

By doing so, a highly reliable display can be provided.

The electronic equipment of the invention includes the display of the invention.

By doing so, highly reliable electronic equipment can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

A light-emitting element, a light-emitting device, a display, and electronic equipment according to the invention will now be described with reference to preferred embodiments shown in the attached drawings.

Figure 1:
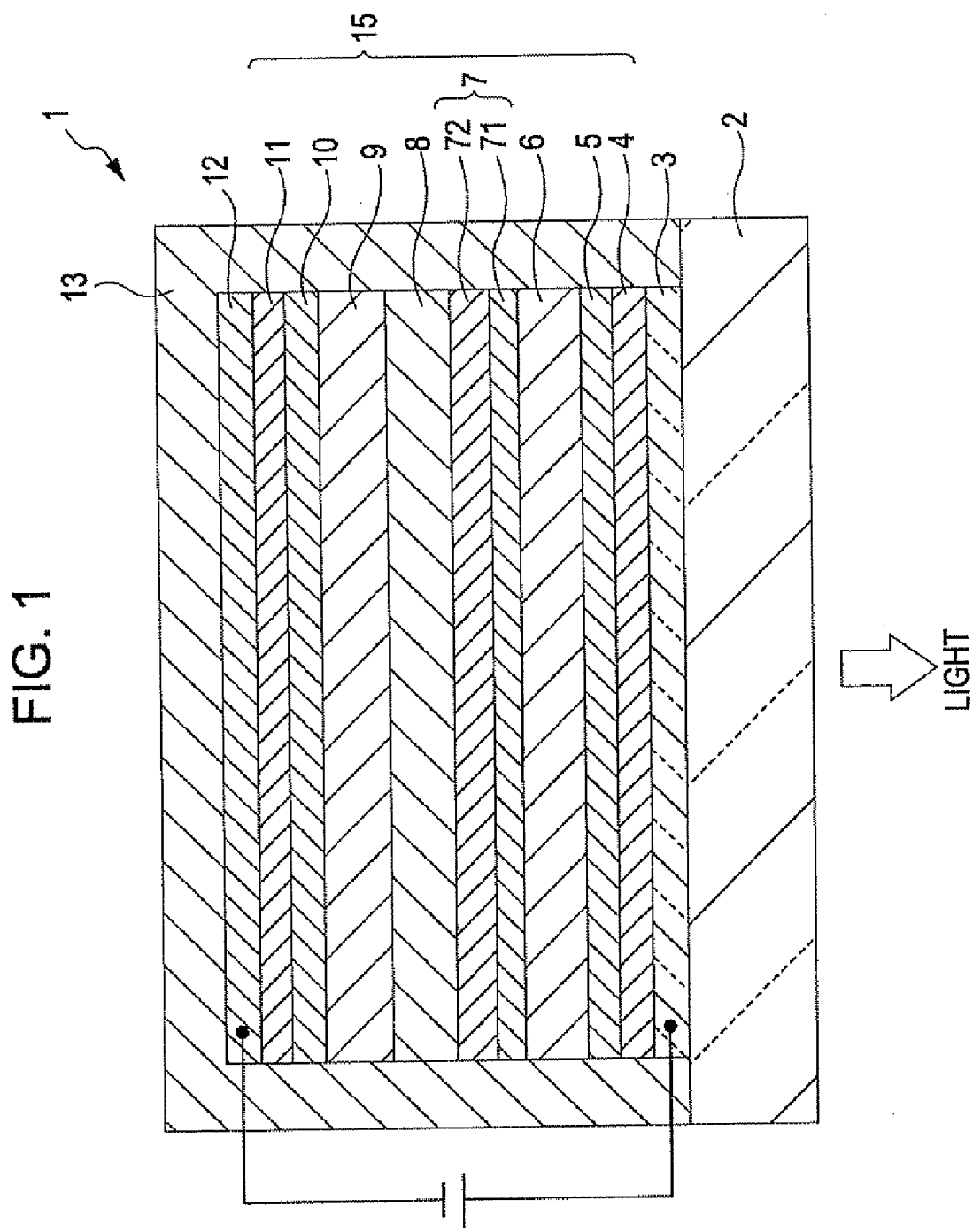
FIG. 1 is a view schematically showing a vertical section of a light-emitting element according to an embodiment of the invention.
Figure 2:
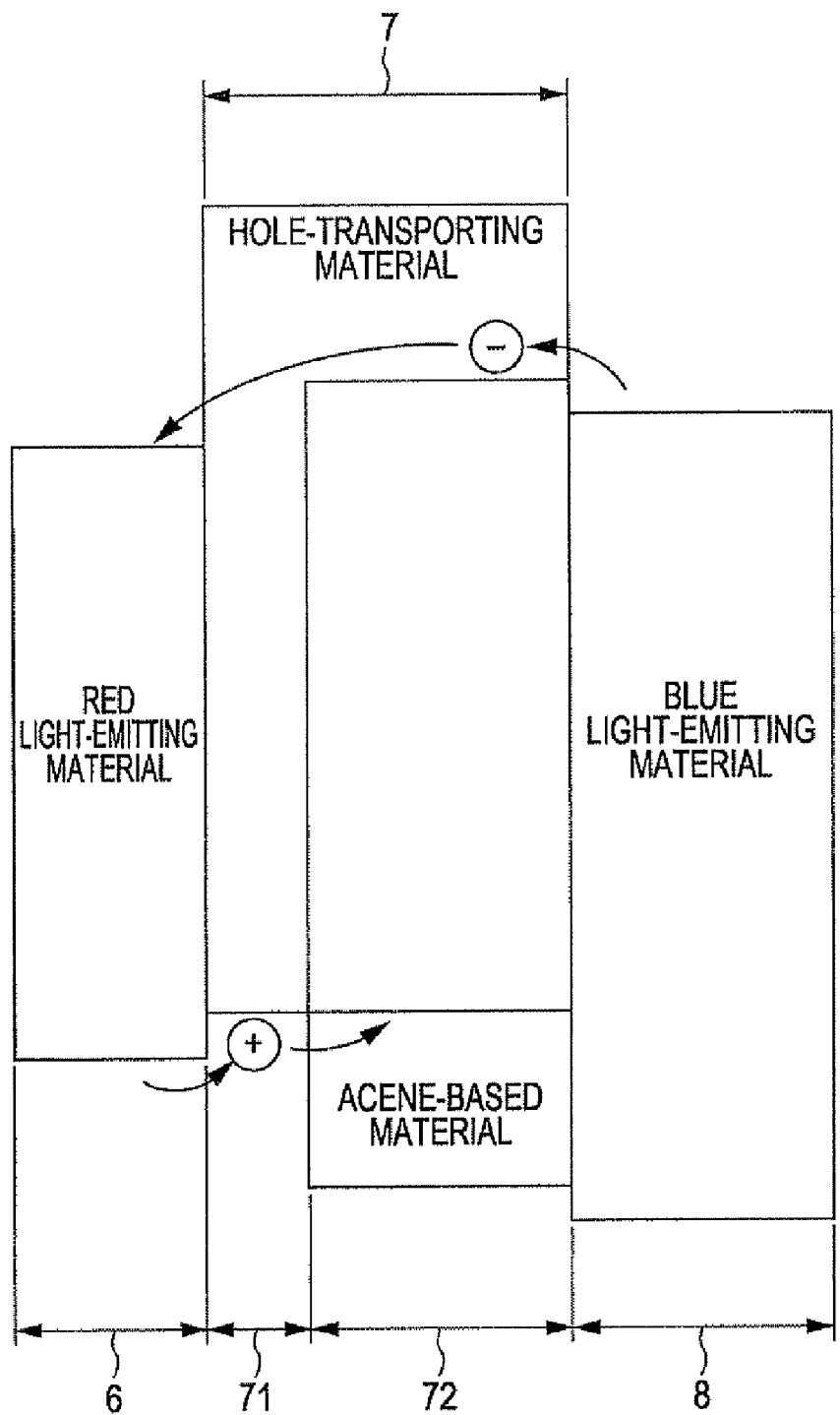
FIG. 2 is a diagram for explaining the function of the intermediate layer in the light-emitting element shown in FIG. 1.

FIG. 1 is a view schematically showing a vertical section of a light-emitting element according to an embodiment of the invention, and FIG. 2 is a diagram for explaining the function of the intermediate layer in the light-emitting element shown in FIG. 1. Note that, hereinafter, the upper side in FIG. 1 is referred to as "top", and the lower side is referred to as "bottom", for convenience of description.

The light-emitting element (electroluminescence element) 1 shown in FIG. 1 emits white light by combining R (red) light, G (green) light, and B (blue) light.

This light-emitting element 1 is composed of an anode 3, a hole injection layer 4, a hole-transporting layer 5, a red light-emitting layer (first light-emitting layer) 6, an intermediate layer 7, a blue light-emitting layer (second light-emitting layer) 8, a green light-emitting layer (third light-emitting layer) 9, an electron-transporting layer 10, an electron injection layer 11, and a cathode 12 that are laminated in this order.

In other words, the light-emitting element 1 is configured by disposing a laminate 15 between two electrodes (between the anode 3 and the cathode 12), wherein the laminate 15 is composed of the hole injection layer 4, the hole-transporting layer 5, the red light-emitting layer 6, the intermediate layer 7, the blue light-emitting layer 8, the green light-emitting layer 9, the electron-transporting layer 10, and the electron injection layer 11 that are laminated in this order from the anode 3 side to the cathode 12 side.

The entire light-emitting element 1 is disposed on a substrate 2 and is sealed with a sealing member 13.

In this light-emitting element 1, each of the red light-emitting layer 6, the blue light-emitting layer 8, and the green light-emitting layer 9 is supplied (injected) with electrons from the cathode 12 side and is also supplied (injected) with holes from the anode 3 side. In each light-emitting layer, holes and electrons are recombined to generate excitons by the energy emitted in the recombination, and energy (fluorescence or phosphorescence) is emitted (light emission) when the excitons return to the ground state, and thereby the light-emitting element 1 emits white light.

The substrate 2 supports the anode 3. Since the light-emitting element 1 of the embodiment has a structure in which light is extracted from the substrate 2 side (bottom emission type), the substrate 2 and the anode 3 are substantially transparent (colorless and transparent, colored and transparent, or translucent).

Examples of the constituent material of the substrate 2 include resin materials such as polyethylene terephthalate, polyethylene naphthalate, polypropylene, cycloolefin polymers, polyamide, polyethersulfone, poly(methyl methacrylate), polycarbonate, and polyacrylate; and glass materials such as silica glass and soda glass. These may be used alone or in a combination.

The average thickness of this substrate 2 is not particularly limited, but is preferably about 0.1 to 30 mm and more preferably about 0.1 to 10 mm.

When the light-emitting element 1 has a structure in which light is extracted from the side opposite to the substrate 2 (top emission type), the substrate 2 may be either a transparent substrate or an opaque substrate.

Examples of the opaque substrate include substrates constituted of ceramics materials such as alumina, those in which metal substrates such as stainless steel sheets having oxide films (insulating films) on their surfaces, and substrates constituted of resin materials.

Each portion constituting the light-emitting element 1 will be described in series.

Anode

The anode 3 is an electrode for injecting holes to the hole-transporting layer 5 through the hole injection layer 4, described below. As the constituent material of the anode 3, a material having a high work-function and being excellent in conductivity is preferred.

Examples of the constituent material of the anode 3 include oxides such as ITO (indium tin oxide), IZO (indium zinc oxide), $In_2O_3$, $SnO_2$, $SnO_2$ containing Sb, and ZnO containing Al; and Au, Pt, Ag, Cu, and alloys thereof. These may be used alone or in a combination.

The average thickness of the anode 3 is not particularly limited, but is preferably about 10 to 200 nm and more preferably about 50 to 150 nm.

Cathode

On the other hand, the cathode 12 is an electrode for injecting electrons to the electron-transporting layer 10 through the electron injection layer 11, described below. As the constituent material of the cathode 12, a material having a low work-function is preferred.

Examples of the constituent material of the cathode 12 include Li, Mg, Ca, Sr, La, Ce, Er, Eu, Sc, Y, Yb, Ag, Cu, Al, Cs, Rb and alloys thereof. These may be used alone or in a combination (for example, a laminate composed of a plurality of layers).

In particular, when an alloy is used as the constituent material of the cathode 12, an alloy containing a stable metal element such as Ag, Al, or Cu, specifically, an alloy such as MgA, AlLi, or CuLi is preferred. By using such an alloy as the constituent material of the cathode 12, the electron injection efficiency and stability of the cathode 12 can be enhanced.

The average thickness of the cathode 12 is not particularly limited, but is preferably about 100 to 1000 nm and more preferably about 100 to 500 nm.

Since the light-emitting element 1 of the embodiment is a bottom emission type, the cathode 12 is not required to be light transmissive.

Hole Injection Layer

The hole injection layer 4 has a function of enhancing the efficiency of hole injection from the anode 3.

The constituent material (hole-injecting material) of the hole injection layer 4 is not particularly limited, and examples thereof include copper phthalocyanine and 4,4',4''-tris(N,N-phenyl-3-methylphenylamino)triphenylamine (m-MTDATA) represented by the following formula 1.

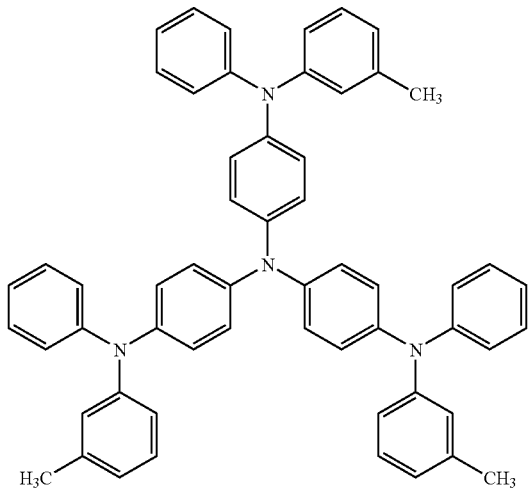

[Formula 1]

The average thickness of this hole injection layer 4 is not particularly limited, but is preferably about 5 to 150 nm and more preferably about 10 to 100 nm.

Note that the hole injection layer 4 may be omitted.

Hole-Transporting Layer

The hole-transporting layer 5 has a function of transporting holes injected from the anode 3 through the hole injection layer 4 to the red light-emitting layer 6.

The constituent material of the hole-transporting layer 5 may be various types of p-type high-molecular-weight materials or various types of p-type low-molecular-weight materials. These may be used alone or in a combination.

The average thickness of the hole-transporting layer 5 is not particularly limited, but is preferably about 10 to 150 nm and more preferably about 10 to 100 nm.

Note that the hole-transporting layer 5 may be omitted.

Red Light-Emitting Layer

The red light-emitting layer (first light-emitting layer) 6 is constituted by containing a red light-emitting material that emits in a red color (first color).

Such a red light-emitting material is not particularly limited, and various types of red fluorescent materials and red phosphorescent materials may be used alone or in a combination.

As the red fluorescent material, any material that emits red fluorescence can be used without particular limitation, and examples thereof include perylene derivatives such as a compound represented by the following formula 2, europium complexes, benzopyran derivatives, rhodamine derivatives, benzothioxanthene derivatives, porphyrin derivatives, nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (DCJTB), and 4-(dicyanomethylene)-2-methyl-6-(p-dimethylaminostyryl)-4H-pyrane (DCM).

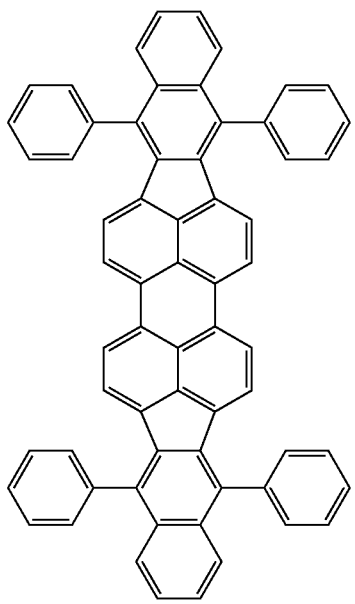

[Formula 2]

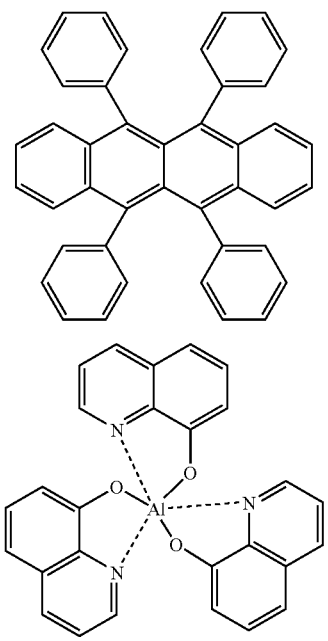

[Formula 3]

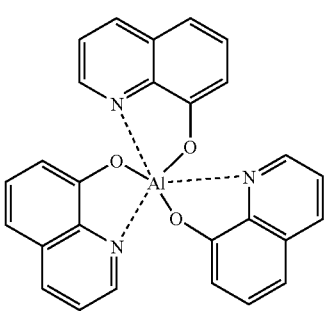

[Formula 4]

As the red phosphorescent material, any material that emits red phosphorescence can be used without particular limitation, and examples thereof include metal complexes of, for example, iridium, ruthenium, platinum, osmium, rhenium, and palladium; and those metal complexes in which at least one ligand of each metal complex has a phenylpyridine skeleton, a bipyridyl skeleton, a porphyrin skeleton, or the like. More specific examples include tris(1-phenylisoquinoline)iridium, bis[2-(2'-benzo[4,5-α]thienyl)pyridinate-N,C$^{3'}$]iridium(acetylacetonate) (btp2Ir(acac)), 2,3,7,8,12,13,17,18-octaethyl-12H,23H-porphyrin-platinum (II), bis[2-(2'-benzo[4,5-α]thienyl)pyridinate-N,C$^{3'}$]iridium, and bis(2-phenylpyridine)iridium(acetylacetonate).

Furthermore, as the constituent material of the red light-emitting layer 6, in addition to the above-mentioned red light-emitting materials, host materials including these red light-emitting materials as guest materials can be used. The host materials have functions of generating excitons by recombining holes and electrons and of exciting the red-light emitting material by transferring the energy of the excitons to the red light-emitting material (Foerster transition or Dexter transition). In the case of using this host material, for example, the red light-emitting material serving as the guest material can be used as a dopant for doping the host material.

The host material is not particularly limited as long as it can show the above-described functions against the red light-emitting material used. When the red light-emitting material contains a red fluorescence-emitting material, examples of the host material include distyrylarylene derivatives, naphthalene derivatives such as rubrene represented by the following formula 3, perylene derivatives, distyrylbenzene derivatives, distyrylamine derivatives, quinolinolato-based metal complexes such as tris(8-quinolinolato)aluminum complex (Alq$^3$) represented by the following formula 4, triarylamine derivatives such as a tetramer of triphenylamine, oxadiazole derivatives, silole derivatives, dicarbazole derivatives, oligothiophene derivatives, benzopyrene derivatives, triazole derivatives, benzoxazole derivatives, benzothiazole derivatives, quinoline derivatives, and 4,4'-bis(2,2'-diphenylvinyl) biphenyl (DPVBi). These may be used alone or in a combination.

When the red light-emitting material contains a red phosphorescent material, examples of the host material include carbazole derivatives such as 3-phenyl-4-(1'-naphtyl)-5-phenylcarbazole and 4,4'-N,N'-dicarbazole biphenyl (CBP). These may be used alone or in a combination.

When the above-described red light-emitting material (guest material) and host material are used, the content (doping amount) of the red light-emitting material in the red light-emitting layer 6 is preferably 0.01 to 10% by weight and more preferably 0.1 to 5% by weight. By controlling the content of the red light-emitting material within such a range, the luminous efficiency can be optimized, and red light-emitting layer 6 can be allowed to emit light while being well balanced with amounts of light emitted by the below-described blue light-emitting layer 8 and the green light-emitting layer 9.

The above-mentioned red light-emitting materials have relatively small band gaps, easily capture holes and electrons, and readily emit light. Therefore, by disposing the red light-emitting layer on the anode 3 side, the blue light-emitting layer 8 and the green light-emitting layer 9, which have large band gaps making light emission difficult, are disposed on the cathode side, and each light-emitting layer is allowed to emit light in a well-balanced manner.

The average thickness of the red light-emitting layer 6 is not particularly limited, but is preferably about 10 to 150 nm and more preferably about 10 to 100 nm.

Intermediate Layer

The intermediate layer 7 is disposed between the above-described red light-emitting layer 6 and the below-described blue light-emitting layer 8 so as to be in contact with them. The intermediate layer 7 has a function of regulating the migration of carriers (holes and electrons) between the red light-emitting layer 6 and the blue light-emitting layer 8. In addition, the intermediate layer 7 has a function of preventing the migration of energy of excitons between the red light-emitting layer 6 and the blue light-emitting layer 8. These functions contribute to efficient emission of light in the red light-emitting layer 6 and the blue light-emitting layer 8.

In particular, the intermediate layer 7 is composed of two layers, i.e., a first layer 71 that is in contact with the red light-emitting layer 6 and a second layer 72 that is in contact with the first layer 71 and the blue light-emitting layer 8. The main material constituting the first layer 71 is a hole-transporting material, and the main material constituting the second layer 72 is a material mixture of a material having an acene skeleton (hereinafter, also called "acene-based material") and a hole-transporting material.

In the intermediate layer 7 composed of two layers, the second layer 72 of the intermediate layer 7 can efficiently transport electrons from the blue light-emitting layer 8 to the first layer 71 of the intermediate layer 7. Therefore, the amount of electrons that accumulate near the interface between the intermediate layer 7 and the blue light-emitting layer 8 can be suppressed. As a result, the blue light-emitting layer 8 can be prevented from being deteriorated, and the lifetime of the light-emitting element 1 can be increased.

In addition, the first layer 71 of the intermediate layer 7 can restrict the amount of electrons that are transported from the second layer 72 of the intermediate layer 7 to the red light-emitting layer 6. Therefore, the amount of electrons injected into the red light-emitting layer 6 and the amount of electrons injected into the blue light-emitting layer 8 can be equalized. As a result, the light emission of the red light-emitting layer 6 and the light emission of the blue light-emitting layer 8 can be well balanced in the light-emitting element 1.

Furthermore, the first layer 71 of the intermediate layer 7 can efficiently transport holes from the red light-emitting layer 6 to the second layer 72 of the intermediate layer 7. Therefore, holes can be efficiently transported from the red light-emitting layer 6 to the blue light-emitting layer 8 through the intermediate layer 7. As a result, the luminous efficiency of the light-emitting element 1 can be enhanced.

Thus, the light-emitting element 1 can have a long lifetime, while light is emitted in a well-balanced manner and with excellent luminous efficiency.

In particular, in the embodiment, the light-emitting layer (first light-emitting layer) adjacent to the anode 3 side of the intermediate layer 7 is the red light-emitting layer 6, and the light-emitting layer (second light-emitting layer) adjacent to the cathode 12 side of the intermediate layer 7 is the blue light-emitting layer 8. The color (first color) of light emitted by the red light-emitting layer 6 has a peak wavelength of 600 nm or more, and the color (second color) of light emitted by the blue light-emitting layer 8 has a peak wavelength of 550 nm or less. In this case, the band gaps between each of the red light-emitting layer 6, the intermediate layer 7, and the blue light-emitting layer 8 can be controlled so that a relationship shown in FIG. 2 is formed. Therefore, the light emitted by the red light-emitting layer 6 and the light emitted by the blue light-emitting layer 8 can be well balanced in the light-emitting element 1.

The hole-transporting materials used in the first layer 71 and the second layer 72 are not particularly limited as long as they are each excellent in hole-transporting ability, but amine-based materials (namely, materials having amine skeletons) are preferably used.

The amine-based material used as the hole-transporting material is not particularly limited ad long as it has an amine skeleton and shows the above-described effects. For example, benzidine-based amine derivatives are preferably used.

In particular, a benzidine-based amine derivative to which two or more naphthyl groups are introduced is preferred as the amine-based material used for the intermediate layer 7. Examples of such a benzidine-based amine derivative include N,N'-bis(1-naphthyl)-N,N'-diphenyl[1,1'-biphenyl]-4,4'-diamine (α-NPD) represented by the following formula 5 and N,N,N',N'-tetranaphthyl-benzidine (TNB) represented by the following formula 6.

[Formula 5]

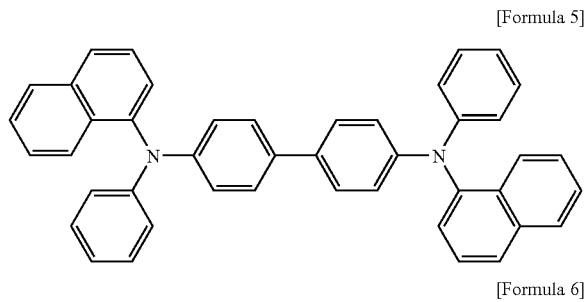

[Formula 6]

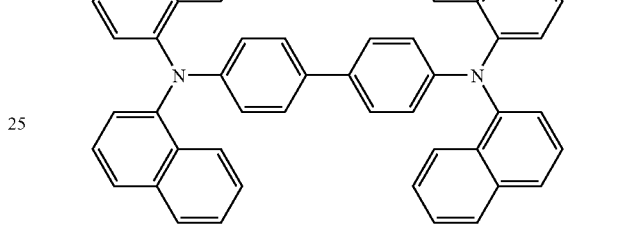

These amine-based materials are excellent in hole-transporting ability. Therefore, the first layer 71 of which main material is such a hole-transporting material can smoothly transfer holes from the red light-emitting layer 6 to the second layer 72. In addition, the first layer 71 has a function of restricting the amount of electrons that are transferred from the second layer 72 to the red light-emitting layer 6.

On the other hand, the acene-based material used in the second layer 72 (material mixture) of the intermediate layer 7 is not particularly limited as long as it has an acene skeleton and shows the above-described effects, and examples thereof include naphthalene derivatives, anthracene derivatives, tetracene derivatives, pentacene derivatives, hexacene derivatives, and heptacene derivatives. These may be used alone or in a combination, and the anthracene derivatives are preferably used.

The anthracene derivatives have excellent electron-transporting ability and can be simply formed into a film by vapor deposition. Therefore, by using an anthracene derivative as the acene-based material, the electron-transporting ability of the acene-based material (consequently, the intermediate layer 7) can be enhanced, and also a homogeneous intermediate layer 7 can be easily formed.

In particular, an anthracene derivative in which a naphthyl group is introduced in each of the 9-position and the 10-position of the anthracene skeleton is preferred as the acene-based material used for the intermediate layer 7. By doing so, the above-described effects become significant. Examples of such an anthracene derivative include 9,10-di(2-naphthyl)anthracene (ADN) represented by the following formula 7,2-t-butyl-9,10-di(2-naphthyl)anthracene (TBADN) represented by the following formula 8, and 2-methyl-9,10-di(2-naphthyl)anthracene (MADN) represented by the following formula 9.

[Formula 7]
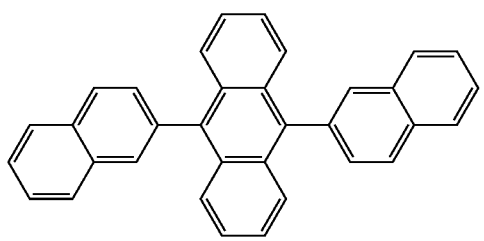

[Formula 8]
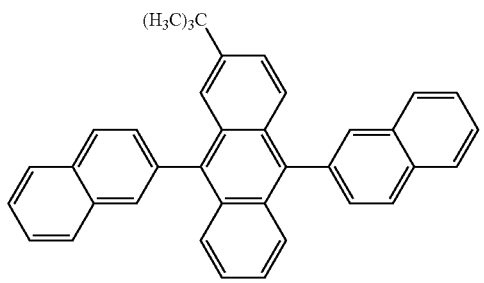

[Formula 9]
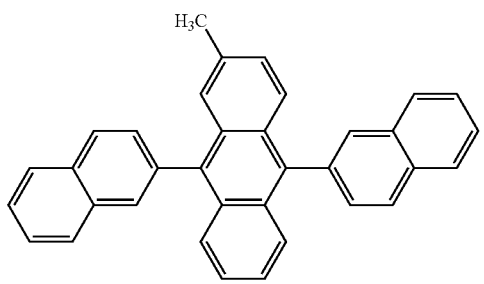

These acene-based materials are excellent in electron-transporting ability. Therefore, the second layer 72 of which main material is a material mixture of such an acene-based material and the above-described hole-transporting material can smoothly transfer holes from the first layer 71 to the blue light-emitting layer 8 and also can smoothly transfer electrons from the blue light-emitting layer 8 to the first layer 71. That is, the second layer 72 has a bipolar property. Therefore, the second layer 72 has excellent resistance to electrons and holes. Consequently, the intermediate layer 7 is prevented from being deteriorated, resulting in an increase in durability of the light-emitting element 1.

The content of the hole-transporting material in the first layer 71 is not particularly limited, but is preferably 50 to 100% by mass, more preferably 70 to 100% by mass, and further preferably 80 to 100% by mass.

Furthermore, the content A (% by mass) of the acene-based material in the second layer 72 and the content B (% by mass) of the hole-transporting material in the second layer 72 are determined such that A:B is preferably 10:90 to 90:10, more preferably 30:70 to 70:30, and further preferably 40:60 to 60:40. By doing so, the electron-transporting ability and the hole-transporting ability of the second layer 72 of the intermediate layer 7 are enhanced.

On the other hand, contents A and B being out of the range have tendencies of lowering the light emission balance of the light-emitting element 1 and of a significant increase in driving voltage of the light-emitting element 1.

In such an intermediate layer 7, as shown in FIG. 2, the first layer 71 is preferably constituted so that electrons are tunnel-injected from the blue light-emitting layer 8 side to the red light-emitting layer 6 side. More specifically, for example, the first layer 71 is preferably a thin layer so that electrons are tunnel-injected from the blue light-emitting layer 8 side to the red light-emitting layer 6 side. By doing so, electrons can be transported from the second layer 72 of the intermediate layer 7 to the red light-emitting layer 6 through the first layer 71. Therefore, the amount of electrons that accumulate near the interface between the first layer 71 and the second layer 72. As a result, the intermediate layer 7 (in particular, the first layer 71) can be prevented from being deteriorated, and the lifetime of the light-emitting element 1 can be increased.

Furthermore, as shown in FIG. 2, the hole-transporting material as the main material of the first layer 71 and the hole-transporting material contained in the second layer 72 are preferably the same type. By doing so, the ability of transporting holes from the first layer 71 of the intermediate layer 7 to the second layer 72 of the intermediate layer 7 can be enhanced. As a result, the luminous efficiency of the light-emitting element 1 can be increased.

The thickness (average thickness) of the first layer 71 is preferably smaller than that of the second layer 72. By doing so, electrons can be transported from the second layer 72 of the intermediate layer 7 to the red light-emitting layer 6, while suppressing the amount of electrons that accumulate near the interface between the intermediate layer 7 and the blue light-emitting layer 8.

More specifically, the thickness of the first layer 71 is preferably 1 to 10 nm, more preferably 3 to 7 nm, and further preferably 3 to 5 nm. By doing so, the first layer 71 of the intermediate layer 7 can transport electrons from the second layer 72 of the intermediate layer 7 to the red light-emitting layer 6, while restricting the amount of electrons that are transported from the second layer 72 of the intermediate layer 7 to the red light-emitting layer 6. In addition, the first layer 71 of the intermediate layer 7 can efficiently transport holes from the red light-emitting layer 6 to the second layer 72 of the intermediate layer 7.

On the other hand, when the thickness of the first layer 71 is smaller than the above-mentioned lower limit, the first layer 71 is difficult to become a homogeneous layer and thereby cannot exhibit the function (electron-blocking property) thereof, resulting in a tendency of lowered balance in light emission of the red light-emitting layer 6 and the blue light-emitting layer 8 of the light-emitting element 1. In addition, the ability of transporting holes from the red light-emitting layer 6 to the second layer 72 of the intermediate layer 7 is decreased. When the thickness of the first layer 71 is larger than the above-mentioned upper limit, transportation of electrons from the second layer 72 through the first layer 71 to the red light-emitting layer 6 is difficult, which causes an increase in driving voltage of the light-emitting element 1 or deterioration of the intermediate layer 7 due to an increase in the amount of electrons that accumulate near the interface between the first layer 71 and the second layer 72. As a result, the lifetime of the light-emitting element 1 may be decreased.

The thickness of the second layer 72 is preferably 1.5 to 10 nm, more preferably 3 to 10 nm, and further preferably 3 to 8 nm. By doing so, the amount of electrons that accumulate near the interface between the intermediate layer 7 and the blue light-emitting layer 8 can be suppressed.

On the other hand, when the thickness of the second layer 72 is smaller than the above-mentioned lower limit, electrons that accumulate near the interface between the first layer 71 and the second layer 72 may reach near the interface between the second layer 72 and the blue light-emitting layer 8 depending on, for example, the constituent material and the thickness of the first layer 71, resulting in deterioration of the blue light-emitting layer 8. Therefore, the lifetime of the light-emitting element 1 may be decreased. When the thickness of the second layer 72 is larger than the above-mentioned upper limit, the transportation of holes and electrons by the second layer 72 becomes difficult, which may cause a decrease in luminous efficiency of the light-emitting element 1 and an increase in driving voltage.

The thickness of the intermediate layer 7 is not particularly limited, but is preferably 2.5 to 20 nm, more preferably 6 to 17 nm, and further preferably 6 to 13 nm. By doing so, the intermediate layer 7 can surely prevent the migration of energy of excitons between the red light-emitting layer 6 and the blue light-emitting layer 8, while suppressing the driving voltage.

On the other hand, when the average thickness of the intermediate layer 7 is larger than the above-mentioned upper limit, the driving voltage may be significantly increased, or emission of light (in particular, white light) of the light-emitting element 1 may become difficult, depending on, for example, the constituent materials of the intermediate layer 7. When the average thickness of the intermediate layer 7 is smaller than the above-mentioned lower limit, it is difficult for the intermediate layer 7 to prevent or suppress the migration of energy of excitons between the red light-emitting layer 6 and the blue light-emitting layer 8, depending on, for example, the constituent materials of the intermediate layer 7 and the driving voltage, and there is a tendency of decreasing the durability of the intermediate layer 7 against carrier and excitons.

Blue Light-Emitting Layer

The blue light-emitting layer (second light-emitting layer) 8 is constituted by containing a blue light-emitting material that emits blue (second color) light.

This blue light-emitting material is not particularly limited, and various types of blue fluorescent materials and blue phosphorescent materials can be used alone or in a combination.

The blue fluorescent material is not particularly limited as long as it emits blue fluorescence, and examples thereof include distyryl derivatives, fluoranthene derivatives, pyrene derivatives, perylene and perylene derivatives, anthracene derivatives, benzoxazole derivatives, benzothiazole derivatives, benzoimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[(9,9-dioctylfluorene-2,7-diyl)-co-(2,5-dimethoxybenzene-1,4-diyl)], poly[(9,9-dihexyloxyfluorene-2,7-diyl)-alt-co-(2-methoxy-5-{2-ethylhexyloxy}phenylene-1,4-diyl)], and poly[(9,9-dioctylfluorene-2,7-diyl)-co-(ethynylbenzene)]. These may be used alone or in a combination.

The blue phosphorescent material is not particularly limited as long as it emits blue phosphorescence, and examples thereof include metal complexes of, for example, iridium, ruthenium, platinum, osmium, rhenium, and palladium and, more specifically, include bis[4,6-difluorophenylpyridinate-N,C$^{2'}$]-picolinate-iridium, tris[2-(2,4-difluorophenyl)pyridinate-N,C$^{2'}$]iridium, and bis[2-(3,5-trifluoromethyl)pyridinate-N,C$^{2'}$]-picolinate-iridium, and bis(4,6-difluorophenylpyridinate-N,C$^{2'}$)iridium(acetylacetonate).

As the constituent material of the blue light-emitting layer 8, as in the red light-emitting layer 6, in addition to the above-described blue light-emitting materials, host materials including these blue light-emitting materials as guest materials can be used.

Furthermore, the blue light-emitting layer 8 preferably contains an acene-based material that is the same type as that contained in the second layer 72 of the intermediate layer 7.

That is, the material having an acetone skeleton contained in the second layer 72 and the material having an acetone skeleton contained in the blue light-emitting layer 8 are preferably the same type. By doing so, the ability of transporting electrons from the blue light-emitting layer 8 to the second layer 72 of the intermediate layer 7 can be enhanced. As a result, the luminous efficiency of the light-emitting element 1 can be increased.

When the above-described blue light-emitting material (guest material) and the host material are used, the content (doping amount) of the blue light-emitting material in the blue light-emitting layer 8 is preferably 0.01 to 10% by weight and more preferably 0.1 to 5% by weight.

The average thickness of the blue light-emitting layer 8 is not particularly limited, but is preferably about 10 to 150 nm and more preferably about 10 to 100 nm.

Green Light-Emitting Layer

The green light-emitting layer (third light-emitting layer) 9 is constituted by containing a green light-emitting material that emits green (third color) light.

The green light-emitting material is not particularly limited, and various types of green fluorescent materials and green phosphorescent materials may be used alone or in a combination.

The green fluorescent material is not particularly limited as long as it emits green fluorescence, and examples thereof include coumarin derivatives, quinacridone derivatives such as a compound represented by the following formula 10, 9,10-bis[(9-ethyl-3-carbazol)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorenylene)-alt-co-(2-methoxy-5-(2-ethoxyhexyloxy)-1,4-phenylene)]. These may be used alone or in a combination.

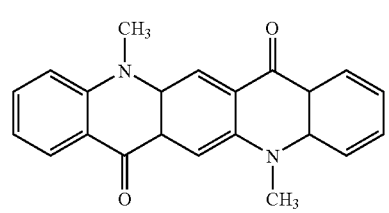

[Formula 10]

The green phosphorescent material is not particularly limited as long as it emits green phosphorescence, and examples thereof include metal complexes of, for example, iridium, ruthenium, platinum, osmium, rhenium, and palladium. In particular, those metal complexes in which at least one ligand of each metal complex has a phenylpyridine skeleton, a bipyridyl skeleton, a porphyrin skeleton, or the like are preferably used. More specific examples include fac-tris(2-phenylpyridine)iridium (Ir(ppy)$_3$), bis(2-phenylpyridinate-N,C2')iridium(acetylacetonate), and fac-tris[5-fluoro-2-(5-trifluoromethyl-2-pyridine)phenyl-C,N]iridium.

As the constituent material of the green light-emitting layer 9, as in the red light-emitting layer 6, in addition to the above-described green light-emitting materials, host materials including these green light-emitting materials as guest materials can be used.

When the above-described green light-emitting material (guest material) and the host material are used, the content (doping amount) of the green light-emitting material in the green light-emitting layer 9 is preferably 0.01 to 10% by weight and more preferably 0.1 to 5% by weight.

The average thickness of the green light-emitting layer 9 is not particularly limited, but is preferably about 10 to 150 nm and more preferably about 10 to 100 nm.

Electron-Transporting Layer

The electron-transporting layer 10 has a function of transporting electrons injected from the cathode 12 through the electron injection layer 11 to the green light-emitting layer 9.

Examples of the constituent material (electron-transporting material) of the electron-transporting layer 10 include quinoline derivatives such as organic metal complexes having 8-quinoline or derivatives thereof, such as tris(8-quinolinolato)aluminum ($Alq_3$), as the ligands, oxadiazole derivatives, perylene derivatives, pyridine derivatives, pyrimidine derivatives, quinoxaline derivatives, diphenylquinone derivatives, and nitro-substituted fluorene derivatives. These may be used alone or in a combination.

The average thickness of the electron-transporting layer 10 is not particularly limited, but is preferably about 0.5 to 100 nm and more preferably about 1 to 50 nm.

Electron Injection Layer

The electron injection layer 11 has a function of enhancing the efficiency of injecting electrons from the cathode 12.

Examples of the constituent material (electron injection material) of the electron injection layer 11 include various types of inorganic insulating materials and various types of inorganic semiconductor materials.

Examples of the inorganic insulating material include alkali metal chalcogenides (oxides, sulfides, selenides, and tellurides), alkali earth metal chalcogenides, halides of alkali metals, and halides of alkali earth metals. These may be used alone or in a combination. When the main material constituting the electron injection layer is any of these inorganic insulating materials, the electron injection ability can be increased. In particular, the alkali metal compounds (such as alkali metal chalcogenides and halides of alkali metals) have very low work-functions. Therefore, the light-emitting element 1 can obtain high luminance by constituting the electron injection layer 11 by the alkali metal compound.

Examples of the alkali metal chalcogenide include $Li_2O$, LiO, $Na_2S$, $Na_2Se$, and NaO.

Examples of the alkali earth metal chalcogenide include CaO, BaO, SrO, BeO, BaS, MgO, and CaSe.

Examples of the halides of alkali metals include CsF, LiF, NaF, KF, LiCl, KCl, and NaCl.

Examples the halides of alkali earth metals include $CaF_2$, $BaF_2$, $SrF_2$, $MgF_2$, and $BeF_2$.

Examples of the inorganic semiconductor materials include oxides, nitrides, and oxynitrides each containing at least one element of Li, Na, Ba, Ca, Sr, Yb, Al, Ga, In, Cd, Mg, Si, Ta, Sb, and Zn. These may be used alone or in a combination.

The average thickness of the electron injection layer 11 is not particularly limited, but is preferably about 0.1 to 1000 nm, more preferably about 0.2 to 100 nm, and further preferably about 0.2 to 50 nm.

Sealing Member

The sealing member 13 is disposed so as to cover the anode 3, the laminate 15, and the cathode 12 and has a function of hermetically sealing them to block them from oxygen and moisture. By providing the sealing member 13, effects such as an increase in reliability of the light-emitting element 1 and an increase in durability due to prevention of degradation and deterioration can be achieved.

Examples of the constituent material of the sealing member 13 include Al, Au, Cr, Nb, Ta, and Ti, and alloys containing these elements, silicon oxide, and various types of resin materials. When the constituent material of the sealing member 13 is a material having conductivity, in order to avoid a short-circuit, an insulating film is preferably disposed between the sealing member 13 and the anode 3, the laminate 15, and the cathode 12, according to need.

The sealing member 13 may have a plate-like shape and may be disposed so as to oppose the substrate 2, and a sealing material such as a thermosetting resin may seal between them.

According to the thus constituted light-emitting element 1, the lifetime is increased, while light is emitted in a well-balanced manner and with excellent luminous efficiency, by using the intermediate layer 7 constituted of two layers, the first layer 71 whose main material is a hole-transporting material and the second layer 72 whose main material is a material mixture of an acene-based material and a hole-transporting material.

In the embodiment, the red light-emitting layer 6, the intermediate layer 7, the blue light-emitting layer 8, and the green light-emitting layer 9 are disposed in this order from the anode 3 side to the cathode 12 side and thereby can emit white light by relatively simply emitting R (red), G (green), and B (blue) light in a well-balanced manner. That is, a white light-emitting element 1 that has excellent luminous efficiency and also has a long lifetime can be provided.

The light-emitting element 1 as described above can be produced, for example, as follows.

[1] First, a substrate 2 is prepared, and an anode 3 is formed on the substrate 2.

The anode 3 can be formed by, for example, a chemical vapor deposition (CVD) process such as plasma CVD or thermal CVD, a dry-plating process such as vacuum vapor deposition, a wet-plating process such as electroplating, a thermal spraying process, a sol-gel process, an MOD process, or adhesion of metal foil.

[2] Subsequently, a hole injection layer 4 is formed on the anode 3.

The hole injection layer 4 can be formed by, for example, a gas-phase process employing, for example, a CVD process or a dry-plating process such as vacuum vapor deposition or sputtering.

Alternatively, the hole injection layer 4 may be formed by, for example, applying a hole injection layer-forming material in which a hole-injecting material is dissolved in a solvent or dispersed in a dispersion medium onto the anode 3 and then performing drying (removing the solvent or the dispersion medium).

The application of the hole injection layer-forming material may be performed by various coating processes, such as spin coating, roll coating, or ink jet printing. By employing such a coating process, the hole injection layer 4 can be relatively easily formed.

Examples of the solvent or the dispersion medium used for preparing the hole injection layer-forming material include various types of inorganic solvents, various types of organic solvents, and solvent mixtures containing them.

The drying can be performed by, for example, being left standing under atmospheric or reduced pressure, heating treatment, or spraying inert gas.

Furthermore, prior to this process, the upper surface of the anode 3 may be subjected to oxygen plasma treatment. By doing so, the top surface of the anode 3 is imparted with a lyophilic property, organic substances attaching on the top surface of the anode 3 are removed (washed out), and the work-function near the top surface of the anode 3 can be controlled, for example.

Herein, preferred conditions for the oxygen plasma treatment are, for example, a plasma power of about 100 to 800 W, an oxygen gas flow rate of about 50 to 100 mL/min, a feeding rate of a member (anode 3) to be treated of about 0.5 to 10 mm/sec, and a temperature of the substrate 2 of about 70 to 90° C.

[3] Then, a hole-transporting layer 5 is formed on the hole injection layer 4.

The hole-transporting layer 5 can be formed by, for example, a gas-phase process employing, for example, a CVD process or a dry-plating process such as vacuum vapor deposition or sputtering.

Alternatively, the hole-transporting layer 5 may be formed by, for example, applying a hole-transporting layer-forming material in which a hole-transporting material is dissolved in a solvent or dispersed in a dispersion medium onto the hole injection layer 4 and then performing drying (removing the solvent or the dispersion medium).

[4] Then, a red light-emitting layer 6 is formed on the hole-transporting layer 5.

The red light-emitting layer 6 can be formed by, for example, a gas-phase process employing, for example, a CVD process or a dry-plating process such as vacuum vapor deposition or sputtering.

[5] Then, a first layer 71 and a second layer 72 are formed in this order on the red light-emitting layer 6 to form an intermediate layer 7.

The first layer 71 and the second layer 72 each can be formed by, for example, a gas-phase process employing, for example, a CVD process or a dry-plating process such as vacuum vapor deposition or sputtering.

[6] Then, a blue light-emitting layer 8 is formed on the intermediate layer 7.

The blue light-emitting layer 8 can be formed by, for example, a gas-phase process employing, for example, a CVD process or a dry-plating process such as vacuum vapor deposition or sputtering.

[7] Then, a green light-emitting layer 9 is formed on the blue light-emitting layer 8.

The green light-emitting layer 9 can be formed by, for example, a gas-phase process employing, for example, a CVD process or a dry-plating process such as vacuum vapor deposition or sputtering.

[8] Then, an electron-transporting layer 10 is formed on the green light-emitting layer 9.

The electron-transporting layer 10 can be formed by, for example, a gas-phase process employing, for example, a CVD process or a dry-plating process such as vacuum vapor deposition or sputtering.

Alternatively, the electron-transporting layer 10 may be formed by, for example, applying an electron-transporting layer-forming material in which an electron-transporting material is dissolved in a solvent or dispersed in a dispersion medium onto the green light-emitting layer 9 and then performing drying (removing the solvent or the dispersion medium).

[9] Then, an electron injection layer 11 is formed on the electron-transporting layer 10.

When an inorganic material is used as the constituent material of the electron injection layer 11, the electron injection layer 11 can be formed by, for example, a gas-phase process employing, for example, a CVD process or a dry-plating process such as vacuum vapor deposition or sputtering, or by, for example, application and burning of an inorganic microparticle ink.

[10] Then, a cathode 12 is formed on the electron injection layer 11.

The cathode 12 can be formed by, for example, vacuum vapor deposition, sputtering, adhesion of metal foil, or application and burning of an inorganic microparticle ink.

The light-emitting element 1 can be obtained through the above-described process.

Lastly, a sealing member 13 is applied to the resulting light-emitting element 1 so as to cover it, and a substrate 2 is attached.

The light-emitting element 1 described above can be used as, for example, a light source. Furthermore, a light-emitting device, such as a light fixture or a backlight of a liquid crystal display, or a display of a display apparatus can be constituted by arranging a plurality of the light-emitting elements 1 in a matrix form.

The drive system of the display apparatus is not particularly limited and may be either an active matrix system or a passive matrix system.

An example of the display apparatus to which the display of the invention is applied will be described below.

Figure 3:
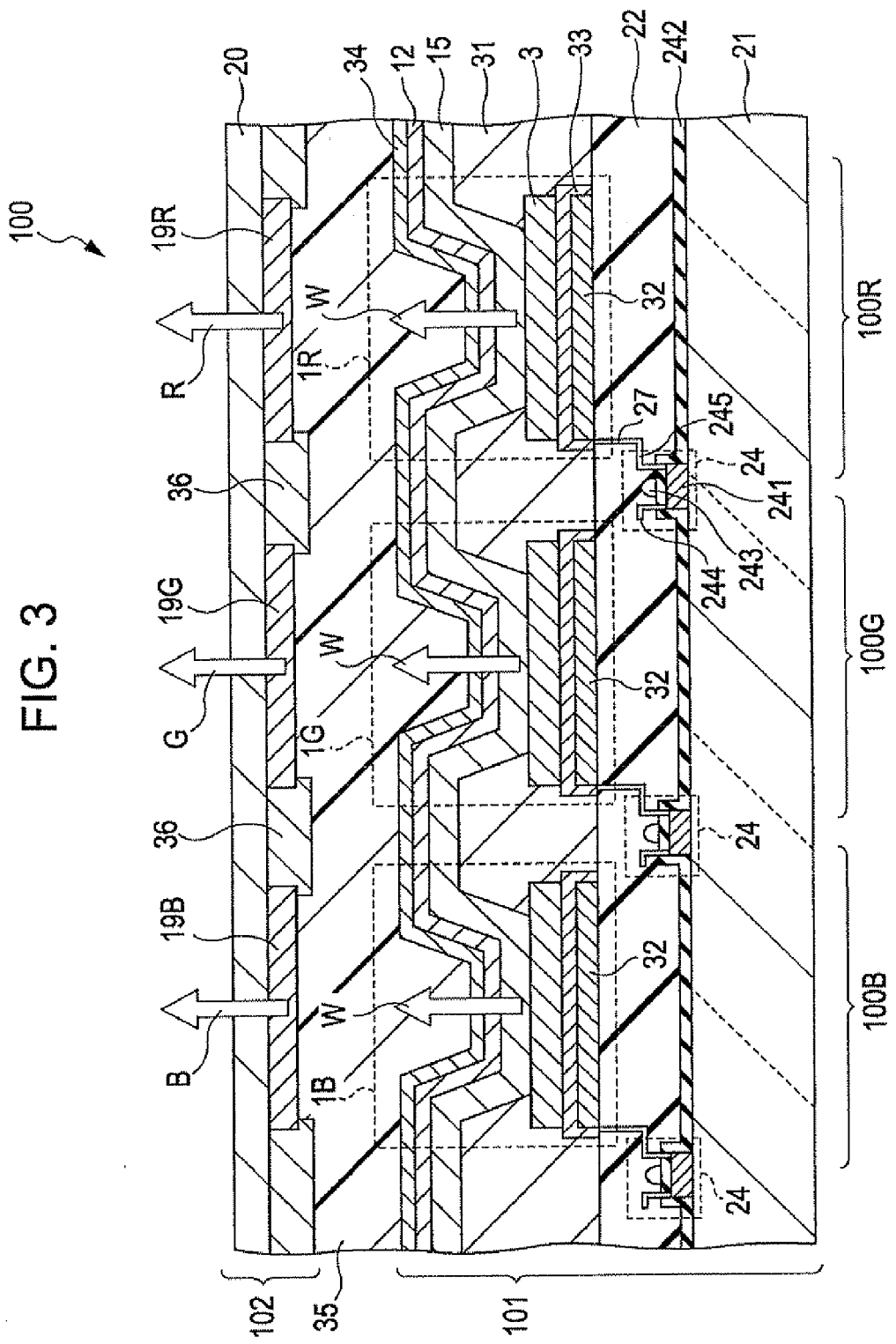
FIG. 3 is a vertical section view showing an embodiment of a display apparatus to which the display of the invention is applied.

FIG. 3 is a vertical section view showing an embodiment of the display apparatus to which the display of the invention is applied.

The display apparatus 100 shown in FIG. 3 includes a substrate 21, a plurality of light-emitting elements 1R, 1G, and 1B and color filters 19R, 19G, and 19B, which respectively corresponding to subpixels 100R, 100G, and 100B, and a plurality of driving transistors 24 for driving each of the light-emitting elements 1R, 1G, and 1B. Here, the display apparatus 100 is a top-emission display panel.

The plurality of the driving transistors 24 are disposed on the substrate 21, and a planarizing layer 22 constituted of an insulating material is disposed so as to cover the driving transistors 24.

The driving transistors 24 each include a semiconductor layer 241 made of silicon, a gate insulating layer 242 disposed on the semiconductor layer 241, a gate electrode 243 disposed on the gate insulating layer 242, a source electrode 244, and a drain electrode 245.

The light-emitting elements 1R, 1G, and 1B are disposed on the planarizing layer 22 so as to correspond to the driving transistors 24.

The light-emitting element 1R is constituted of a reflective layer 32, a corrosion prevention film 33, an anode 3, a laminate (organic EL emitting portion) 15, a cathode 12, and a cathode cover 34, laminated in this order on the planarizing layer 22. In the embodiment, the anode 3 of each of the light-emitting elements 1R, 1G, and 1B constitutes the pixel electrode and is electrically connected to the drain electrode 245 of each driving transistor 24 via a conductive portion (wiring) 27. The cathode 12 of each of the light-emitting elements 1R, 1G, and 1B is a common electrode.

The light-emitting elements 1G and 1B each have the same constitution as that of the light-emitting element 1R. In FIG. 3, the same constitution as that in FIG. 1 is shown by the same numeral. The reflective layers 32 of the light-emitting elements 1R, 1G, and 1B may have constitutions (characteristics) that are different from one another according to the light wavelength.

Between each adjacent light-emitting elements 1R, 1G, and 1B, a partition wall 31 is disposed. Furthermore, an epoxy layer 35 made of an epoxy resin is disposed on the light-emitting elements 1R, 1G, and 1B to cover them.

The color filters 19R, 19G, and 19B are disposed on the epoxy layer 35 so as to correspond the light-emitting elements 1R, 1G, and 1B.

The color filter 19R extracts red light from white light W emitted by the light-emitting element 1R. The color filter 19G extracts green light from white light W emitted by the light-emitting element 1G. The color filter 19B extracts blue light from white light W emitted by the light-emitting element 1B. By using these color filters 19R, 19G, and 19B in combination with the light-emitting element 1R, 1G, and 1B, a full color image can be displayed.

Between each adjacent color filters 19R, 19G, and 19B, a light-shielding layer 36 is disposed. By doing so, unexpected light emission by the subpixels 100R, 100G, and 100B can be prevented.

Furthermore, a sealing substrate 20 is disposed on the color filters 19R, 19G, and 19B and the light-shielding layer 36 to cover them.

The display apparatus 100 described above may be a monochromatic display or also can display a color image by selecting the light-emitting materials used in the light-emitting elements 1R, 1G, and 1B.

The display apparatus 100 (the display of the invention) can be set in various types of electronic equipment.

Figure 4:
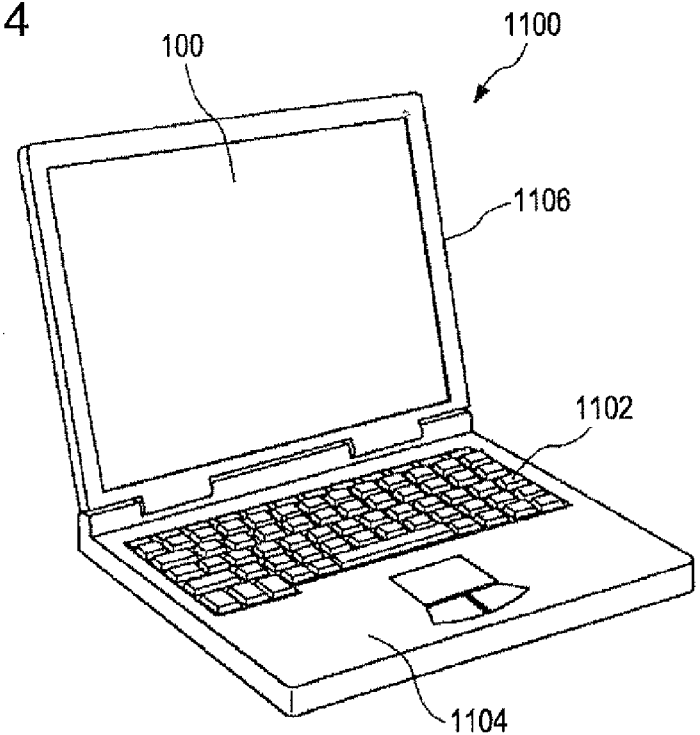
FIG. 4 is a perspective view showing a structure of a mobile (or note-type) personal computer to which the electronic equipment of the invention is applied.

FIG. 4 is a perspective view showing a structure of a mobile (or note-type) personal computer to which the electronic equipment of the invention is applied.

In this drawing, the personal computer 1100 is constituted of a body portion 1104 having a keyboard 1102 and a display unit 1106 having a display portion. The display unit 1106 is held via a hinge structure portion so as to be rotatable with respect to the body portion 1104.

In the personal computer 1100, the display portion of the display unit 1106 is constituted of the above-described display apparatus 100.

Figure 5:
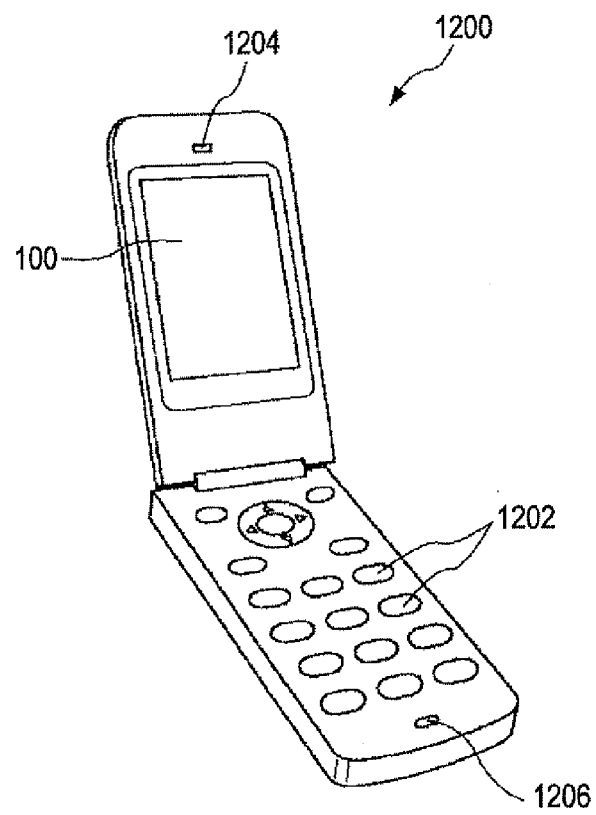
FIG. 5 is a perspective view showing a structure of a mobile phone (including PHS) to which the electronic equipment of the invention is applied.

FIG. 5 is a perspective view showing a structure of a mobile phone (including PHS) to which the electronic equipment of the invention is applied.

In this drawing, the mobile phone 1200 includes a plurality of operation buttons 1202, an ear piece 1204, a mouthpiece 1206, and also a display.

In the mobile phone 1200, the display portion is constituted of the above-described display apparatus 100.

Figure 6:
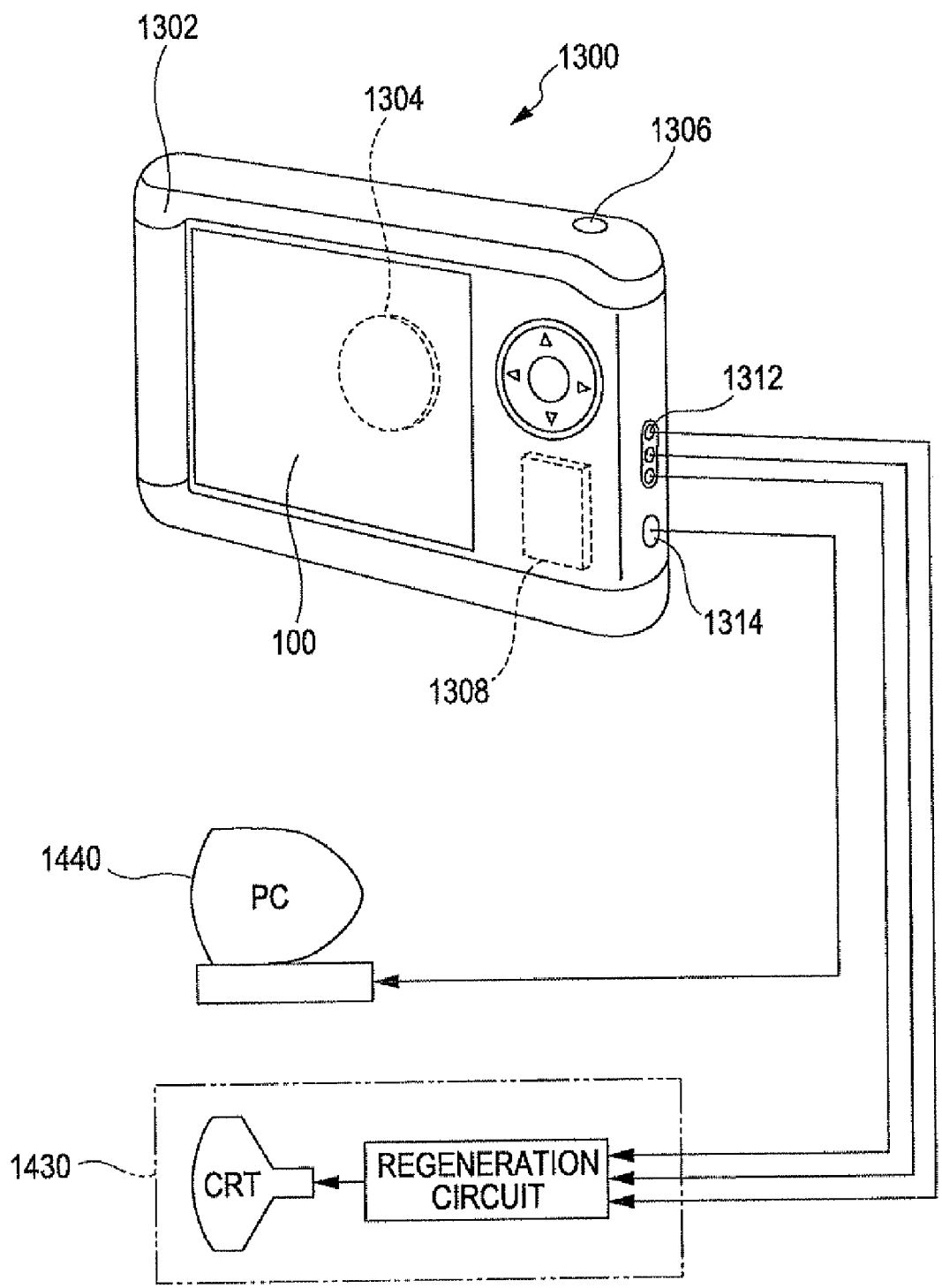
FIG. 6 is a perspective view showing a structure of a digital still camera to which the electronic equipment of the invention is applied.

FIG. 6 is a perspective view showing a structure of a digital still camera to which the electronic equipment of the invention is applied. Note that this drawing also schematically shows connection with external equipment.

Here, the digital still camera 1300 generates an image pickup signal (image signal) by photoelectrical conversion of an optical image of an object with an image pickup device such as a charge coupled device (CCD), unlike in usual cameras in which a silver halide photographic film is exposed to an optical image of an object.

A display portion is provided on the back side of a case (body) 1302 of the digital still camera 1300. The display portion is configured so as to display an image according to image pickup signals from the CCD and functions as a finder for displaying an object as an electronic image In the digital still camera 1300, the display portion is constituted of the above-described display apparatus 100.

In the inside of the case, a circuit board 1308 is installed. The circuit board 1308 has a memory that can store (record) image pickup signals.

On the front side (the rear surface side in the structure shown in the drawing) of the case 1302, a light-receiving unit 1304 including an optical lens (image pickup optical system), a CCD, and the like is provided.

When a photographer confirms an object image displayed on the display portion and pushes down a shutter button 1306, the image pickup signal of the CCD at that time is transferred to and stored in the memory of the circuit board 1308.

In the digital still camera 1300, a video signal output terminal 1312 and data communication input-output terminal 1314 are provided on a side face of the case 1302. As shown in the drawing, the video signal output terminal 1312 is connected to a television monitor 1430, and the date communication input-output terminal 1314 is connected to a personal computer 1440, according to need. Furthermore, it is configured such that an image pickup signal stored in the memory of the circuit board 1308 is output to the television monitor 1430 or the personal computer 1440 by a predetermined operation.

The electronic equipment of the invention can be applied to, in addition to the personal computer (mobile personal computer) shown in FIG. 4, the mobile phone shown in FIG. 5, and the digital still camera shown in FIG. 6, for example, television sets, video cameras, viewfinder type or monitor-direct-view type video tape recorders, laptop type personal computers, car navigation devices, pagers, electronic organizers (including those having communication functions), electronic dictionaries, electronic calculators, electronic game equipment, word processors, work stations, visual telephones, security television monitors, electronic binoculars, POS terminals, apparatuses including touch panels (for example, cash dispensers of financial institutions and automatic ticket vending machines), medical equipment (for example, electronic thermometers, blood-pressure monitors, blood-sugar meters, electrocardiograph displays, ultrasonographs, and endoscope displays), fishfinders, various types of measuring instrument, meters and gauges (for example, meters and gauges of vehicles, aircraft, and ships), flight simulators, other various types of monitors, and projection displays such as projectors.

Thus, the light-emitting element, the light-emitting device, the display, and the electronic equipment of the invention have been described based on the embodiments shown in the drawings, but the invention is not limited thereto.

For example, in the above-described embodiments, the light-emitting element including three light-emitting layers has been described, but the number of the light-emitting layers may be two or four or more. In addition, the colors of light emitted by the light-emitting layers are not limited to R, G, and B described in the embodiments. Furthermore, when the number of the light-emitting layers is two or four or more, white light can be emitted by suitably setting light emission spectrum of each light-emitting layer.

The number of the intermediate layers disposed between the light-emitting layers may be one or two or more.

EXAMPLES

Specific examples of the invention will be described below.

1. Production of Light-Emitting Element

Example 1

(1) First, a transparent glass substrate having an average thickness of 0.5 mm was prepared. Then, an ITO electrode (anode) with an average thickness of 100 nm was formed on the substrate by sputtering.

Then, the substrate was immersed in acetone and then in 2-propanol for ultrasonic cleansing, followed by oxygen plasma treatment.

(2) Then, m-MTDATA represented by the above-mentioned formula 1 was vapor-deposited on the ITO electrode by vacuum vapor deposition to form a hole injection layer with an average thickness of 30 nm.

(3) Then, α-NPD represented by the above-mentioned formula 5 was vapor-deposited on the hole injection layer by vacuum vapor deposition to form a hole-transporting layer with an average thickness of 20 nm.

(4) Then, constituent materials of a red light-emitting layer were vapor-deposited on the hole-transporting layer by vacuum vapor deposition to form a red light-emitting layer (first light-emitting layer) with an average thickness of 10 nm. As the constituent materials of the red light-emitting layer, a compound represented by the above-mentioned formula 2 was used as the red light-emitting material (guest material), and rubrene represented by the above-mentioned formula 3 was used as the host material. The content (doping concentration) of the light-emitting material (dopant) in the red light-emitting layer was 1.0% by weight.

(5) Then, constituent materials of a first layer and a second layer of an intermediate layer were each vapor-deposited on the red light-emitting layer by vacuum vapor deposition to form an intermediate layer composed of the first layer and the second layer and having an average thickness of 10 nm.

Here, α-NPD represented by the above-mentioned formula 5 was used as the hole-transporting material constituting the first layer, and α-NPD represented by the above-mentioned formula 5 and TBADN represented by the above-mentioned formula 8 (a mixture of these materials) were used as the hole-transporting material and the acene-based material constituting the second layer. The content of the hole-transporting material in the second layer was 50% by weight, and the content of the acene-based material in the second layer was 50% by weight.

The thickness of the first layer was 5 nm, and the thickness of the second layer was 5 nm.

(6) Then, constituent materials of a blue light-emitting layer were vapor-deposited on the intermediate layer (second layer) by vacuum vapor deposition to form a blue light-emitting layer (second light-emitting layer) with an average thickness of 7 nm. As the constituent materials of the blue light-emitting layer, BD102 (manufactured by Idemitsu Kosan Co., Ltd.) was used as the blue light-emitting material, and TBADN represented by the above-mentioned formula 8 was used as the host material. The content (doping concentration) of the blue light-emitting material (dopant) in the blue light-emitting layer was 5.0% by weight.

(7) Then, constituent materials of a green light-emitting layer were vapor-deposited on the blue light-emitting layer by vacuum vapor deposition to form a green light-emitting layer (third light-emitting layer) with an average thickness of 20 nm. As the constituent materials of the green light-emitting layer, a quinacridone derivative represented by the above-mentioned formula 10 was used as the green light-emitting material (guest material), and $Alq_3$ represented by the above-mentioned formula 4 was used as the host material. The content (doping concentration) of the green light-emitting material (dopant) in the green light-emitting layer was 5.0% by weight.

(8) Then, $Alq_3$ represented by the above-mentioned formula 4 was deposited on the green light-emitting layer by vacuum vapor deposition to form an electron-transporting layer having an average thickness of 20 nm.

(9) Then, lithium fluoride (LiF) was deposed on the electron-transporting layer by vacuum vapor deposition to form an electron injection layer having an average thickness of 1 nm.

(10) Then, Al was deposited on the electron injection layer by vacuum vapor deposition. Thus, a cathode constituted of Al and having an average thickness of 200 nm was formed.

(11) Then, a protection cover (sealing member) of glass was put on so as to cover the thus formed layers, followed by fixation and sealing by an epoxy resin.

By the above-described process, a light-emitting element as shown in FIG. 1 was produced.

Example 2

A light-emitting element was produced as in Example 1, except that the thickness of the first layer of the intermediate layer was 3 nm.

Example 3

A light-emitting element was produced as in Example 1, except that the thickness of the first layer of the intermediate layer was 1 nm.

Comparative Example 1

A light-emitting element was produced as in Example 1, except that the intermediate layer having a thickness of 7 nm was formed by only α-NPD represented by the above-mentioned formula 5. That is, the light-emitting element was formed as in Example 1, except that the second layer was not formed and the thickness of the first layer was 7 nm.

Comparative Example 2

A light-emitting element was produced as in Example 1, except that the intermediate layer having a thickness of 7 nm was formed by only a material mixture (50:50) of α-NPD represented by the above-mentioned formula 5 and TBADN represented by the above-mentioned formula 8. That is, the light-emitting element was formed as in Example 1, except that the first layer was not formed and the thickness of the second layer was 7 nm.

Comparative Example 3

A light-emitting element was produced as in Comparative Example 2, except that the thickness of the intermediate layer was 15 nm. That is, the light-emitting element was produced as in Example 1, except that the first layer was not formed, and the thickness of the second layer was 15 nm.

2. Evaluation 2-1. Evaluation of Light Emission Peak Intensity Ratio

A constant current was applied to each light-emitting element of the examples and the comparative examples with a direct current source, and the light emission peak intensity ratio was measured.

Table 1 shows the results.

TABLE 1

| | Intermediate layer | | | | Light emission peak intensity ratio | | | Lifetime characteristics LT80 (H) 100 mA/cm² | Light emission intensity W/(m² · sr) |
|---|---|---|---|---|---|---|---|---|---|
| | First layer | | Second layer | | | | | | |
| | Constituent material | Thickness (nm) | Constituent material | Thickness (nm) | R | G | B | | |
| Example 1 | α-NPD | 5 | α-NPD + TBADN | 5 | 0.7 | 0.9 | 1.2 | 2.5 | 2.97 |
| Example 2 | α-NPD | 3 | α-NPD + TBADN | 5 | 1.0 | 0.8 | 1.1 | 3.0 | 3.09 |
| Example 3 | α-NPD | 1 | α-NPD + TBADN | 5 | 1.3 | 0.4 | 0.7 | 3.0 | 2.82 |
| Comparative Example 1 | α-NPD | 7 | — | — | 1.0 | 0.7 | 0.2 | 1.0 | 3.16 |
| Comparative Example 2 | — | — | α-NPD + TBADN | 7 | 1.4 | 0.4 | 0.6 | 3.0 | 2.88 |
| Comparative Example 3 | — | — | α-NPD + TBADN | 15 | 1.4 | 0.3 | 0.6 | 3.2 | 2.79 |

2-2. Evaluation of Light Emission Lifetime

A constant current of 100 mA/cm² was continued to be applied to each light-emitting element of the examples and the comparative examples with a direct current source, and luminance during the application was measured with a luminance meter, and the time (LT80) required for reducing the luminance level to 80% of the initial level was measured. The half period was measured for five light-emitting elements in each of the examples and the comparative examples.

The results are shown in Table 1. The lifetime characteristics shown in Table 1 are expressed as a relative value, provided that the lifetime of the light-emitting element in Comparative Example 1 is 1 (standard).

2-3. Evaluation of Luminous Efficiency (Light Emission Intensity)

A constant current was applied to each light-emitting element of the examples and the comparative examples with a direct current source, and the luminance (initial luminance) was measured with a luminance meter. The luminance was measured for five light-emitting elements in each of the examples and the comparative examples.

The results are shown in Table 1.

As obvious from Table 1, the light-emitting element in each example could have a long lifetime, while light is emitted in a well-balanced manner and with excellent luminous efficiency.

On the other hand, though the light-emitting element of Comparative Example 1 was satisfactory in light emission balance (balance of light emission peak intensity ratio) and luminous efficiency (light emission intensity), the durability (lifetime characteristics) was low. Though the light-emitting elements of Comparative Examples 2 and 3 were excellent in durability (lifetime characteristics), light emission balance (balance of light emission peak intensity ratio) and luminous efficiency (light emission intensity) were low.

The entire disclosure of Japanese Patent Application No. 2009-063556, filed Mar. 16, 2009 is expressly incorporated by reference herein.

What is claimed is:

1. A light-emitting element comprising:
  a cathode;
  an anode;
  a first light-emitting layer that is disposed between the cathode and the anode and emits in a first color;
  a second light-emitting layer that is disposed between the first light-emitting layer and the cathode and emits in a second color that is different from the first color; and
  an intermediate layer that is disposed between the first light-emitting layer and the second light-emitting layer so as to be in contact with these layers and has a function of controlling the migration of holes and electrons between the first light-emitting layer and the second light-emitting layer,
  wherein the intermediate layer is constituted of a first layer that is in contact with the first light-emitting layer and is constituted of a hole-transporting material serving as a main material and a second layer that is in contact with the first layer and also with the second light-emitting layer and is constituted of a material mixture, serving as a main material, of a material having an acene skeleton and a hole-transporting material.

2. The light-emitting element according to claim 1, wherein the first layer is constituted such that electrons are tunnel-injected from the second light-emitting layer side to the first light-emitting layer side.

3. The light-emitting element according to claim 1, wherein the hole-transporting material serving as the main material of the first layer and the hole-transporting material contained in the second layer are the same type.

4. The light-emitting element according to claim 1, wherein the second light-emitting layer is constituted by containing a material having an acene skeleton; and the material having the acene skeleton contained in the second light-emitting layer and the material having the acene skeleton contained in the second layer are the same type.

5. The light-emitting element according to claim 1, wherein the first layer has a thickness smaller than that of the second layer.

6. The light-emitting element according to claim 5, wherein the thickness of the first layer is 1 to 10 nm.

7. The light-emitting element according to claim 5, wherein the thickness of the second layer is 1.5 to 10 nm.

8. The light-emitting element according to claim 1, wherein the content A (% by mass) of the material having the acene skeleton in the second layer and the content B (% by mass) of the hole-transporting material in the second layer are determined such that A:B is 10:90 to 90:10.

9. The light-emitting element according to claim 1, wherein the first color has a peak wavelength of 600 nm or more, and the second color has a peak wavelength of 550 nm or less.

10. The light-emitting element according to claim 1, further comprising a third light-emitting layer that is disposed between the second light-emitting layer and the cathode and emits in a third color that is different from the first and second colors.

11. The light-emitting element according to claim 10, wherein the first color is red, the second color is blue, and third color is green.

12. A light-emitting device comprising a light-emitting element according to claim 1.

13. A display comprising a light-emitting element according to claim 1.

14. Electronic equipment comprising a display according to claim 13.

* * * * *